United States Patent
Hu

(10) Patent No.: US 12,144,205 B2
(45) Date of Patent: Nov. 12, 2024

(54) DISPLAY PANEL, MANUFACTURING METHOD FOR DISPLAY PANEL, AND DISPLAY APPARATUS

(71) Applicant: SHENZHEN CHINA STAR OPTOELECTRONICS SEMICONDUCTOR DISPLAY TECHNOLOGY CO., LTD., Shenzhen (CN)

(72) Inventor: Zehu Hu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 504 days.

(21) Appl. No.: 17/600,486

(22) PCT Filed: Aug. 23, 2021

(86) PCT No.: PCT/CN2021/113991
§ 371 (c)(1),
(2) Date: Sep. 30, 2021

(87) PCT Pub. No.: WO2023/019603
PCT Pub. Date: Feb. 23, 2023

(65) Prior Publication Data
US 2023/0050529 A1    Feb. 16, 2023

(30) Foreign Application Priority Data
Aug. 16, 2021    (CN) .......................... 202110935889.2

(51) Int. Cl.
*H01L 27/32*    (2006.01)
*H01L 51/56*    (2006.01)
(Continued)

(52) U.S. Cl.
CPC ......... *H10K 59/122* (2023.02); *H10K 59/123* (2023.02); *H10K 59/124* (2023.02);
(Continued)

(58) Field of Classification Search
CPC ............... H10K 59/123; H10K 59/124; H10K 59/8501; H10K 59/80515;
(Continued)

(56) References Cited

U.S. PATENT DOCUMENTS 7,863,811 B2 *   1/2011   Jun ....................... H10K 59/124
                                                                          313/506
10,326,095 B2 *  6/2019   Kang ..................... H10K 50/18
(Continued)

FOREIGN PATENT DOCUMENTS

CN    108511492 A    9/2018
CN    108807496 A    11/2018
(Continued)

OTHER PUBLICATIONS

Machine translation, Lin, Chinese Pat. Pub. No. CN111739910A, translation date: Jul. 1, 2024, Clarivate Analytics, all pages. (Year : 2024).*
(Continued)

*Primary Examiner* — Victoria K. Hall
(74) *Attorney, Agent, or Firm* — The Roy Gross Law Firm, LLC; Roy Gross

(57) ABSTRACT

The present application provides a display panel, a manufacturing method for a display panel, and a display apparatus. The display panel includes an array substrate including a planarization layer, the planarization layer being provided with a groove; a pixel definition layer (PDL) arranged on the planarization layer and filling the groove, the PDL being provided with a pixel opening; and an anode arranged between the planarization layer and the PDL, an end of the
(Continued)

anode being placed in the groove, and a middle portion of the anode being exposed in the pixel opening.

15 Claims, 3 Drawing Sheets

(51) Int. Cl.
*H10K 59/122* (2023.01)
*H10K 59/123* (2023.01)
*H10K 59/124* (2023.01)
*H10K 59/80* (2023.01)
*H10K 71/00* (2023.01)
*H10K 59/12* (2023.01)

(52) U.S. Cl.
CPC ......... *H10K 59/8051* (2023.02); *H10K 71/00* (2023.02); *H10K 59/1201* (2023.02)

(58) Field of Classification Search
CPC ....... H10K 59/80516; H10K 59/80518; H10K 50/81–818; H10K 59/8051
See application file for complete search history.

(56) References Cited

U.S. PATENT DOCUMENTS

| | | | | |
|---|---|---|---|---|
| 2009/0039773 | A1* | 2/2009 | Jun | H10K 59/122 313/504 |
| 2012/0001186 | A1* | 1/2012 | Kondoh | H10K 59/123 438/34 |
| 2012/0049175 | A1* | 3/2012 | Ono | H10K 59/122 438/34 |
| 2015/0221708 | A1 | 8/2015 | Go et al. | |
| 2017/0025641 | A1* | 1/2017 | Zhang | H10K 59/876 |
| 2017/0062490 | A1* | 3/2017 | Noh | H01L 27/1225 |
| 2018/0342694 | A1* | 11/2018 | Tang | H10K 50/82 |
| 2019/0157629 | A1* | 5/2019 | Wang | H10K 50/865 |
| 2020/0185471 | A1* | 6/2020 | Lee | H10K 50/84 |
| 2023/0133139 | A1* | 5/2023 | Zhang | H10K 59/80518 257/40 |

FOREIGN PATENT DOCUMENTS

| | | | | |
|---|---|---|---|---|
| CN | 109427689 | A | | 3/2019 |
| CN | 110416281 | A | | 11/2019 |
| CN | 111162095 | A * | 5/2020 | ........... G09G 3/3208 |
| CN | 111739910 | A * | 10/2020 | ....... H01L 29/78633 |
| CN | 111863908 | A | | 10/2020 |
| KR | 10-0712212 | B1 * | 4/2007 | ........... H10K 59/122 |
| KR | 20080057789 | A | | 6/2008 |

OTHER PUBLICATIONS

Machine translation, Korean Pat. Pub. No. KR10-0712212-B1, translation date: Jul. 1, 2024, Espacenet, all pages. (Year: 2024).*

* cited by examiner

DISPLAY PANEL, MANUFACTURING METHOD FOR DISPLAY PANEL, AND DISPLAY APPARATUS

TECHNICAL FIELD

The present application relates to of display devices technologies, and more particularly, to a display panel, a manufacturing method for a display panel, and a display apparatus.

BACKGROUND

An organic light-emitting diode (OLED) display screen has the advantages of self-illumination, ultra-thinness, fast response, wide viewing angle, low power consumption and the like, and is considered to be the most promising display device.

In an OLED device, an anode is generally made of metals, such as indium tin oxide (ITO)/Ag/ITO and indium zinc oxide (IZO)/Ag/IZO, which are common composite structures. With the optimization of a process, an anode etching process has evolved from three-step etching, to two-step etching, and finally to one-step etching. In addition, engineering manufacturing of the three-step etching process reduces costs and improves efficiency.

However, the process has the disadvantage that an etching time needs to be prolonged because the process requires that there is no etching residue at a lower ITO film layer. As a result, the etching amount of the Ag film layer is much greater than that of the ITO film layer. The Ag film layer retreats severely, and the Ag film layer in the middle of the composite film layer retreats. Consequently, the upper ITO film layer at some locations of an etched substrate loses support and collapses, and functions to wrap a sidewall of the Ag film layer, which affects a further action of a solution on the Ag film layer. In some locations, the upper layer of ITO does not collapse, and the Ag film layer is exposed and further corroded. As a result, Ag is exposed at an edge of a step. The exposed Ag oxidizes and grows in the air, forming relatively large bumps. When a pixel definition layer (PDL) is made, if the PDL is relatively thin and cannot cover a grown oxide of Ag, it will eventually lead to a short circuit between an anode and a cathode, resulting in a macroscopic appearance of uneven brightness, thereby affecting the display effect of an organic light-emitting device.

SUMMARY

The present application provides a display panel, a manufacturing method for a display panel, and a display apparatus, to solve the problem that an anode metal is easily exposed.

The present application provides a display panel, including:

an array substrate including a planarization layer, the planarization layer being provided with a groove;

a PDL arranged on the planarization layer and filling the groove, the PDL being provided with a pixel opening; and an anode arranged between the planarization layer and the PDL, an end of the anode being placed in the groove, and a middle portion of the anode being exposed in the pixel opening.

In the display panel according to the present application, a gap is provided between the anode and a sidewall of the groove.

In the display panel according to the present application, the groove includes a first groove body and a second groove body that are spaced; and one end of the anode is located in the first groove body, and the other end thereof is located in the second groove body.

In the display panel according to the present application, the array substrate includes a base, an active layer, a gate layer and a source-drain layer that are stacked in sequence, the planarization layer is disposed on the source-drain layer, and the source-drain layer includes a source and a drain; and the planarization layer is provided with a through hole, the through hole communicates with the second groove body, the source is partially exposed in the through hole, and the anode is in contact with the source via the through hole.

The display panel according to the present application further includes:

a transition layer arranged between the drain and the anode, the transition layer filling the through hole.

In the display panel according to the present application, a height of the groove ranges from 0.5 μm to 1 μm, and the height is a distance from a bottom wall of the groove to an opening end face of the groove.

In the display panel according to the present application, a distance between one side of the PDL that faces away from the planarization layer and a bottom wall of the groove ranges from 0.6 μm to 7 μm.

In the display panel according to the present application, the PDL includes:

a plurality of first sub-pixel definition layers, orthographic projections thereof on the array substrate being arranged in a first direction; and a plurality of second sub-pixel definition layers, orthographic projections thereof on the array substrate being arranged in a second direction, a height of the second sub-pixel definition layer being greater than a height of the first sub-pixel definition layer, and the first direction and the second direction intersecting.

In the display panel according to the present application, a luminescent material of the same color is arranged between two adjacent second sub-pixel definition layers, and the luminescent material covers the first sub-pixel definition layer between the two second sub-pixel definition layers.

In the display panel according to the present application, the anode includes a first transparent electrode, a metal electrode and a second transparent electrode that are stacked in sequence.

The present application further provides a manufacturing method for a display panel, including:

providing an array substrate including a planarization layer, and forming a groove in the planarization layer through etching;

manufacturing an anode on the planarization layer, and placing an end of the anode in the groove; and manufacturing a PDL, the PDL filling the groove and covering the anode and the planarization layer, and forming a pixel opening on the PDL through etching, so that the anode is partially exposed in the pixel opening.

The present application further provides a display apparatus, including a display panel, where the display panel includes:

an array substrate including a planarization layer, the planarization layer being provided with a groove;

a PDL arranged on the planarization layer and filling the groove, the PDL being provided with a pixel opening; and an anode arranged between the planarization layer and the PDL, an end of the anode being placed in the groove, and a middle portion of the anode being exposed in the pixel opening.

In the display apparatus according to the present application, a gap is provided between the anode and a sidewall of the groove.

In the display apparatus according to the present application, the groove includes a first groove body and a second groove body that are spaced; and one end of the anode is located in the first groove body, and the other end thereof is located in the second groove body.

In the display apparatus according to the present application, the array substrate includes a base, an active layer, a gate layer and a source-drain layer that are stacked in sequence, the planarization layer is disposed on the source-drain layer, and the source-drain layer includes a source and a drain; and the planarization layer is provided with a through hole, the through hole communicates with the second groove body, the source is partially exposed in the through hole, and the anode is in contact with the source via the through hole.

In the display apparatus according to the present application, the display panel further includes:

a transition layer arranged between the drain and the anode, the transition layer filling the through hole.

In the display apparatus according to the present application, a height of the groove ranges from 0.5 μm to 1 μm, and the height is a distance from a bottom wall of the groove to an opening end face of the groove.

In the display apparatus according to the present application, the PDL includes:

a plurality of first sub-pixel definition layers, orthographic projections thereof on the array substrate being arranged in a first direction; and a plurality of second sub-pixel definition layers, orthographic projections thereof on the array substrate being arranged in a second direction, a height of the second sub-pixel definition layer being greater than a height of the first sub-pixel definition layer, and the first direction and the second direction intersecting.

In the display apparatus according to the present application, a luminescent material of the same color is arranged between two adjacent second sub-pixel definition layers, and the luminescent material covers the first sub-pixel definition layer between the two second sub-pixel definition layers.

In the display apparatus according to the present application, the anode includes a first transparent electrode, a metal electrode and a second transparent electrode that are stacked in sequence.

The present application has the beneficial effects that a groove is formed in a planarization layer of an array substrate, so that an end of an anode located between the planarization layer and a PDL falls in the groove after etching to enable the PDL to cover the end of the anode, and a height at which the PDL covers the end of the anode is increased without changing the height of the PDL relative to the anode. This prevents the anode from being exposed during etching, so as to achieve a better protection effect.

BRIEF DESCRIPTION OF DRAWINGS

The following detailed description of the specific implementations of the present application with reference to accompanying drawings makes the technical solutions and other beneficial effects of the present application apparent.

DESCRIPTION OF EMBODIMENTS

Figure 1:
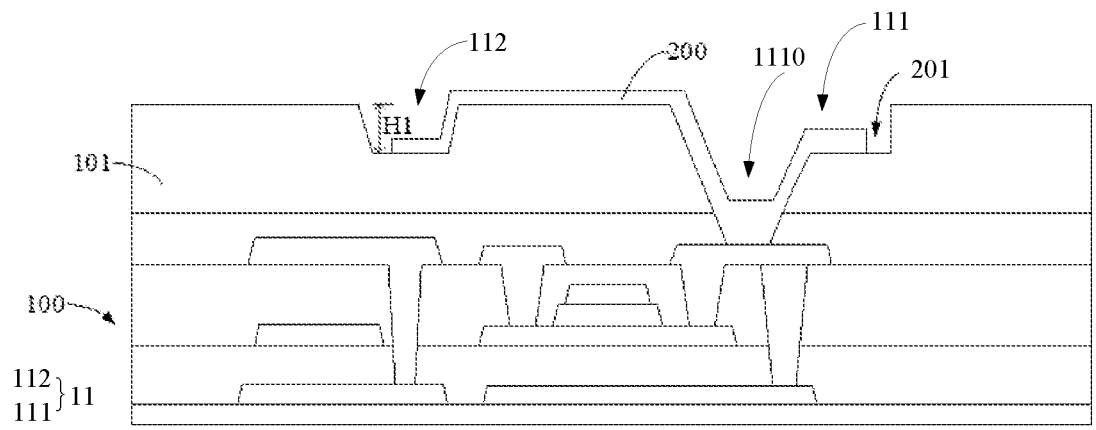
FIG. 1 is a schematic structural diagram of a display panel according to an embodiment of the present application.

The technical solutions in the embodiments of the present application are clearly and completely described below with reference to the accompanying drawings in the embodiments of the present application. The described embodiments are merely some rather than all of the embodiments of the present application. Based on the embodiments of the present application, all other embodiments obtained by a person skilled in the art without creative efforts shall fall within the protection scope of the present application.

In the description of the present application, it should be understood that the orientation or positional relationship indicated by the terms "center", "longitudinal", "transverse", "length", "width", "thickness", "upper", "lower", "front", "rear", "left", "right", "vertical", "horizontal", "top", "bottom", "inner", "outer", "clockwise" and "counterclockwise" is based on the orientation or positional relationship shown in the accompanying drawings, and is only for the convenience of describing the present application and simplifying the description, rather than indicating or implying that the apparatus or component referred to must have a specific orientation, be constructed and operated in a specific orientation, which therefore cannot be understood as a limitation to the present application.

In the present application, unless expressly stipulated and defined otherwise, that a first feature is "above" or "below" a second feature may include that the first feature is in direct contact with the second feature, or may include that the first feature and the second feature are not in direct contact but are in contact through another feature therebetween. Moreover, that the first feature is "above" the second feature includes that the first feature is over or obliquely above the second feature, or simply means that the first feature has a higher level than the second feature. That the first feature is "below" the second feature includes that the first feature is under or obliquely below the second feature, or simply means that the first feature has a lower level than the second feature.

The following disclosure provides many different implementations or examples to implement different structures of the present application. To simplify the disclosure of the present application, components and arrangements of specific examples are described below. Certainly, they are merely examples and are not intended to limit the present application. In addition, in the present application, references may be repeatedly made to numerals and/or reference letters in different examples. The repetition is for simplification and clarity, and the repetition itself does not indicate the relationship between the various implementations and/or arrangements described. In addition, the present application provides examples of various specific processes and materials, but a person of ordinary skill in the art may be aware of application of other processes and/or use of other materials.

Figure 2:
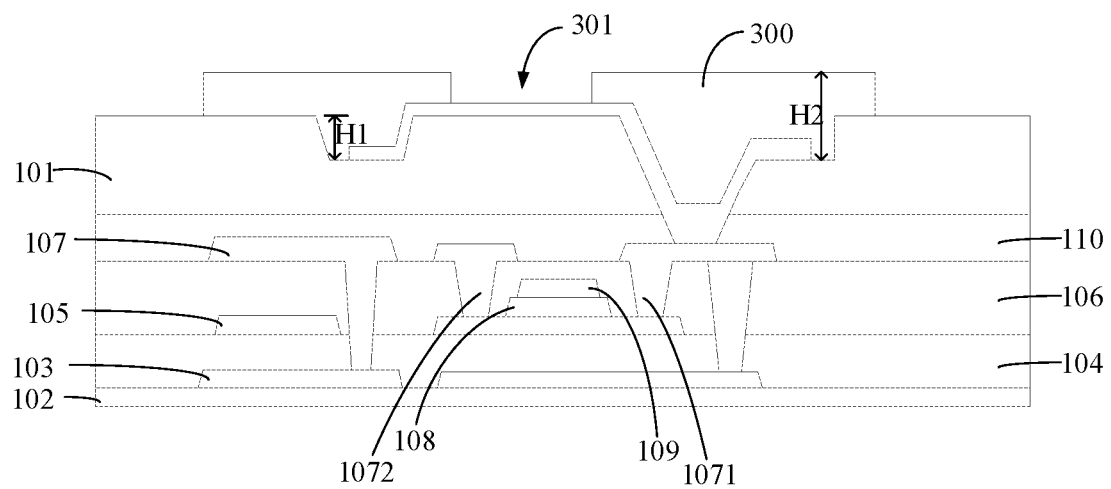
FIG. 2 is a schematic structural diagram of a PDL of a display panel according to an embodiment of the present application.

Referring to FIG. 1 and FIG. 2, an embodiment of the present application provides a display panel, including an array substrate 100, an anode 200 and a PDL 300.

The array substrate 100 includes a planarization layer 101, and the planarization layer 101 is provided with a groove 11.

The PDL 300 is arranged on the planarization layer 101 and fills the groove 11, and the PDL 300 is provided with a pixel opening 301, where the pixel opening 301 is used to form sub-pixels.

The anode 200 is arranged between the planarization layer 101 and the PDL 300, an end of the anode is placed in the groove 11, and a middle portion of the anode 200 is exposed in the pixel opening 301. The anode 200 has two opposite ends, such as a left end and a right end. Accordingly, two grooves 11 may also be provided. For example, a left groove and a right groove are provided separately, so that the left end of the anode 200 is located in the left groove, the right end of the anode 200 is located in the right groove, and thus the anode 200 can be better protected.

In the display panel according to the embodiment of the present application, the groove 11 is formed in the planarization layer 101 of the array substrate 100, so that the end of the anode 200 located between the planarization layer 101 and the PDL 300 falls in the groove 11 after etching to enable the PDL 300 to cover the end of the anode 200, and a height at which the PDL 300 covers the end of the anode 200 is increased without changing the height of the PDL 300 relative to the anode 200. This prevents the anode 200 from being exposed during etching, so as to achieve a better protection effect.

In some embodiments, a gap 201 is provided between the anode 200 and a sidewall of the groove 11. Specifically, an end face of the anode 200 and an inner wall of the groove 11 are spaced. Through the arrangement of the gap 201 between the end face of the anode 200 and the inner wall of the groove 11, the PDL 300 can be deposited on a bottom wall of the groove 11, and a coating depth of the end face of the anode 200 is larger, thereby further protecting the anode 200 from etching and further protecting the anode 200.

In some embodiments, the groove 11 includes a first groove body 111 and a second groove body 112 that are spaced. One end of the anode 200 is located in the first groove body 111, and the other end thereof is located in the second groove body 112. Specifically, gaps are provided between two ends of the anode 200 and sidewalls of both the first groove body 111 and the second groove body 112, respectively, and the two ends of the anode 200 are arranged on bottom walls of both the first groove body 111 and the second groove body 112, respectively.

In some embodiments, the array substrate 100 includes a plurality of switching devices arranged in an array, where the switching devices may be thin-film transistors.

Specifically, the array substrate 100 includes a base 102. An active layer 105, a gate insulation (GI) layer 108, a gate 109, an interlayer dielectric layer (IDL) 106 and a source-drain layer 107 are sequentially formed on the base 102. The planarization layer 101 is arranged on the source-drain layer 107, the source-drain layer 107 includes a source 1071 and a drain 1072, and a channel is formed between the source 1071 and the drain 1072. When a certain voltage is applied to the gate 109, the source 1071 and the drain 1072 are connected through the active layer 105 to transmit a data signal.

In some embodiments, the planarization layer 101 is provided with a through hole 1110, the through hole 1110 communicates with the first groove body 111, the source 1071 is partially exposed in the through hole 1110, and the anode 200 is in contact with the source 1071 via the through hole 1110.

The array substrate 100 further includes a plurality of insulating layers including, for example, a light shield (LS) layer 103, a buffer layer (BL) 104 and a protective layer (PVS) 110. The light shield layer 103 is connected to the source 1071, so that during the operation of the display panel, the light shield layer 103 has the same voltage as the source 1071 and the anode 200, which can prevent parasitic capacitance from being generated between the light shield layer 103 and another conductive structure in the display panel.

Figure 3:
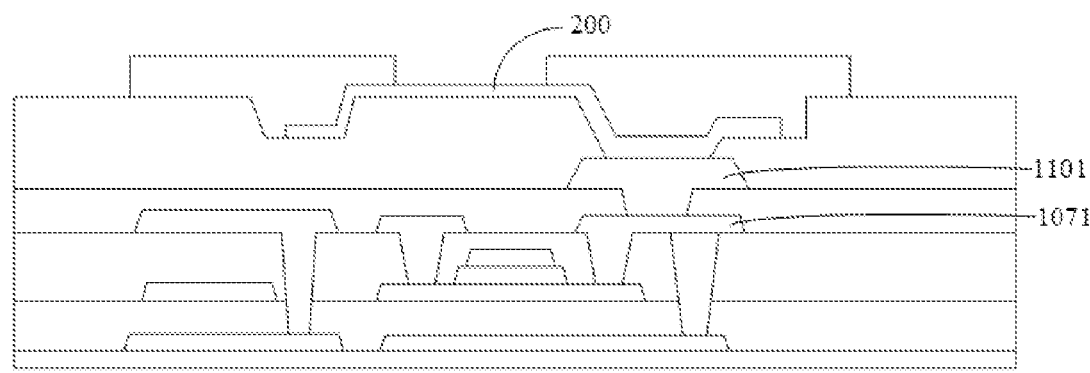
FIG. 3 is a schematic structural diagram of a transition layer of a display panel according to an embodiment of the present application.

In some embodiments, as shown in FIG. 1 to FIG. 3, the display panel further includes a transition layer 1101.

The transition layer 1101 is arranged between the source 1071 and the anode 200, and the transition layer 1101 fills the through hole 1110.

For example, the source-drain layer 107 may be made of copper, and the transition layer 1101 may be made of molybdenum, titanium, etc., so that the transition layer 1101 and the source 1071 may have a metal double-layer structure, such as molybdenum/copper, titanium/copper, molybdenum niobium/copper, molybdenum titanium/copper and other film layers, which can play a protective role and prevent the source 1071 of the array substrate 100 from being oxidized by water vapor and oxygen during the manufacturing process.

In some embodiments, a height H1 of the groove 11 ranges from 0.5 μm to 1 μm, and the height is a distance from a bottom wall of the groove 11 to an opening end face of the groove 11. It can be understood that the specific value of H1 may be set based on actual needs, and is not specifically limited herein. For example, the value of H1 may be 0.5 μm, 0.8 μm, or 1 μm. In addition, it should be noted that when there are a plurality of grooves 11, such as two grooves correspondingly provided at the two ends of the anode, the values of the heights H1 of the grooves may be the same or different. For example, the height of the groove located on the left side is 0.5 μm, and the height of the groove on the right side is 0.8 μm. In addition, opening end faces of the grooves on the left side and right side may be located on the same horizontal line, or may be staggered at high and low positions. Similarly, bottom walls may be located on the same horizontal line, or may be staggered at high and low positions. Various parameters such as the heights of the grooves, the positions of the opening end faces and the positions of the bottom walls of the grooves may be set based on actual needs, and are not specifically limited herein. The values of the heights H1 of the grooves are set within a reasonable range, so that other metal layers below the anode 200 are prevented from being penetrated through, and at the same time, the anode 200 can be protected.

In some embodiments, a distance H2 between one side of the PDL 300 that faces away from the planarization layer 101 and a bottom wall of the groove 11 ranges from 0.6 μm to 7 μm. It can be understood that the specific value of H2 may be set based on actual needs, and is not specifically limited herein. For example, the value of H2 may be 0.6μn, 1 μm, 5 μm, or 7 μm. The distance between the PDL 300 and the bottom wall of the groove 11 is limited within a reasonable range, ensuring that costs are reduced while the anode 200 is not over-etched to cause metal exposure.

Figure 4:
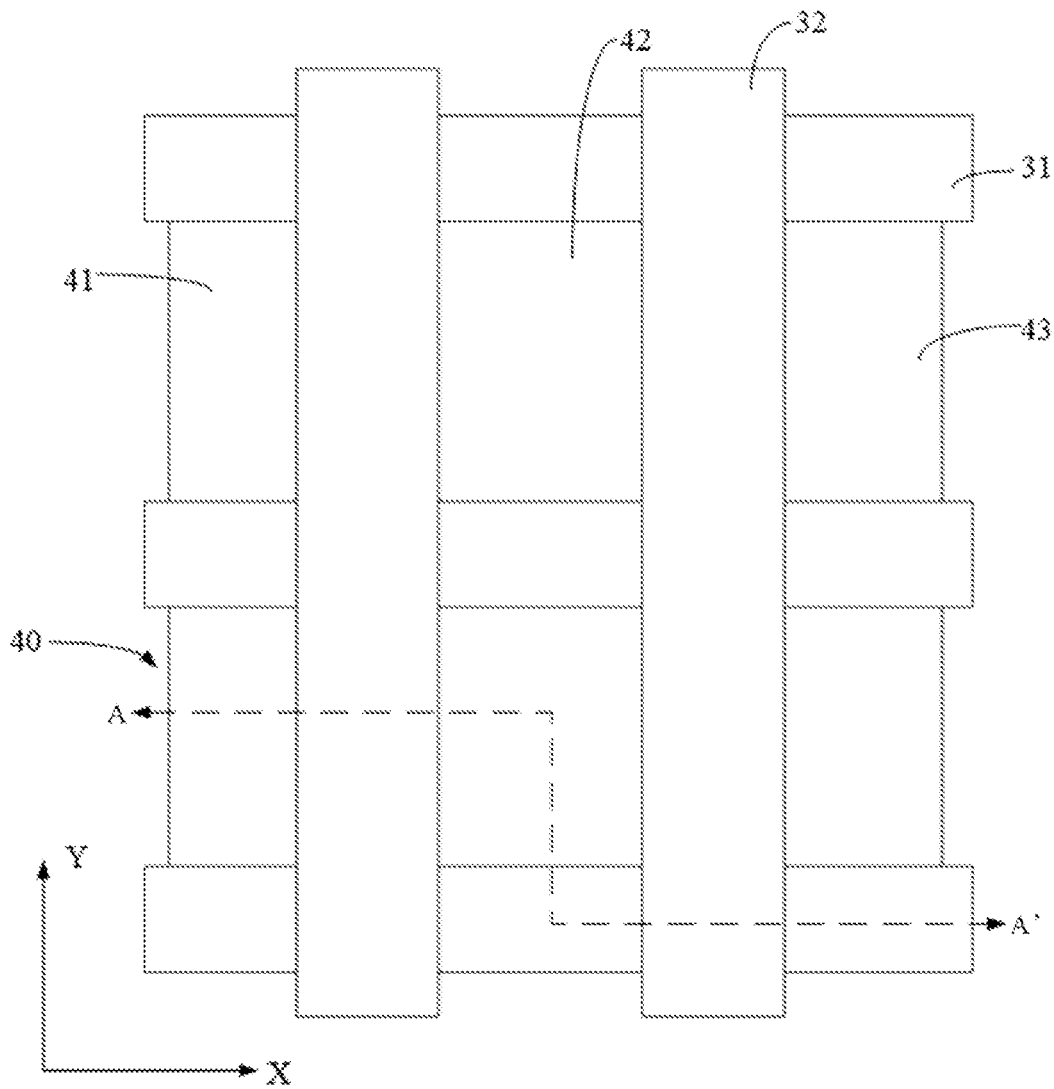
FIG. 4 is a top view of a pixel structure according to an embodiment of the present application.

In some embodiments, as shown in FIG. 4, the array substrate 100 further includes a luminescent material 40.

The luminescent material 40 is disposed in the pixel opening 301. The luminescent material 40 includes a red luminescent material 41, a blue luminescent material 42 and a green luminescent material 43 in sequence. The arrangement sequence of the red luminescent material 41, the blue luminescent material 42 and the green luminescent material 43 is only schematic, and is not used as a limitation to the present application.

Figure 5:
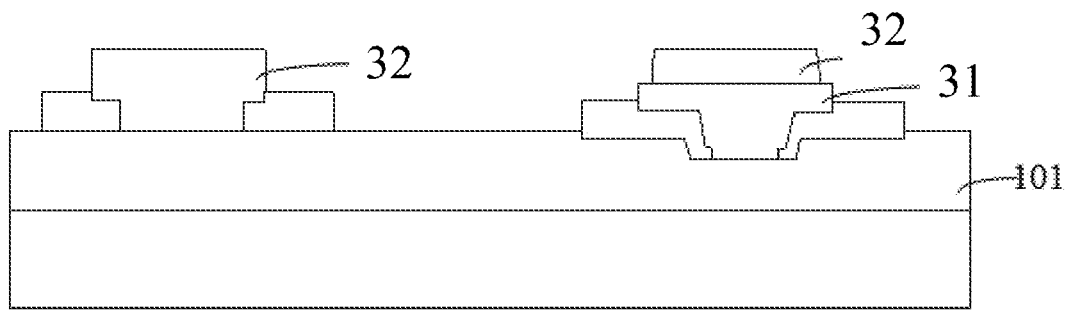
FIG. 5 is a schematic diagram of a cross-sectional structure of a pixel structure in FIG. 3 along AA' according to the present application.

For example, as shown in FIG. 4 and FIG. 5, the present application may use a line bank structure, which is composed of first sub-pixel definition layers 31 (Bank1) and second sub-pixel definition layers 32 (Bank2) arranged in rows and columns. The first sub-pixel definition layer 31 and the second sub-pixel definition layer 32 have different thicknesses, and the second sub-pixel definition layer 32 is thicker than the first sub-pixel definition layer 31. The first sub-pixel definition layer 31 and the second sub-pixel definition layer 32 are made of organic materials, where the second sub-pixel definition layer 32 is made of a hydrophobic material, the first sub-pixel definition layer 31 is made of a hydrophilic material, so that in an ink printing process, a luminescent material 40 of ink may flow in the first sub-pixel definition layer 31.

In some embodiments, as shown in FIG. 5, the PDL 300 includes a first sub-pixel definition layer 31 and a second sub-pixel definition layer 32.

Orthographic projections of a plurality of first sub-pixel definition layers 31 on the array substrate 100 are arranged in a first direction X. In this embodiment, the first direction X is specifically a horizontal direction.

Orthographic projections of a plurality of second sub-pixel definition layers 32 on the array substrate 100 are arranged in a second direction Y, and the first direction X and the second direction Y intersect. In this embodiment, the second direction Y is specifically a vertical direction, and the first direction X and the second direction Y are perpendicular to each other.

As shown in FIG. 5, the height of the second sub-pixel definition layer 32 is greater than the height of the first sub-pixel definition layer 31. Reducing the thickness of the first sub-pixel definition layer 31 can improve the climbing fluidity of the luminescent material 40 during printing, so that the luminescent material 40 of the same color can be better attached to the first sub-pixel definition layer 31. The thickness of the second sub-pixel definition layer 32 needs to be set thicker to better separate the luminescent materials 40 of different colors and prevent the luminescent materials 40 from mixing colors and affecting the display effect of the display panel.

In some embodiments, the first sub-pixel definition layer 31 is made of an inorganic material, and the second sub-pixel definition layer 32 is made of an organic hydrophobic material. Specifically, the second sub-pixel definition layer 32 may be made of silicone, organic fluorine, polyolefin, polycarbonate, polyamide or polyacrylonitrile. The process for the inorganic material may decrease the thickness of the first sub-pixel definition layer 31 and improve the thinning level. After the thickness of the first sub-pixel definition layer 31 is reduced, the climbing fluidity of the luminescent material 40 can be improved. When the first sub-pixel definition layer 31 is made of the organic material, the horizontal length of the first sub-pixel definition layer 31 is reduced while the thickness of the first sub-pixel definition layer 31 is reduced. In addition, the climbing fluidity of the ink made of the luminescent material 40 may further be improved. The second sub-pixel definition layer 32 is mainly configured to separate luminescent materials 40 of different colors, and thus an organic hydrophobic material is used to prevent the luminescent materials 40 from mixing colors and affecting the display effect. Specifically, the first sub-pixel definition layer 31 is made of any one or a combination of more of silicon oxide, silicon nitride or silicon oxynitride.

In some embodiments, a luminescent material 40 of the same color is arranged between two adjacent second sub-pixel definition layers 32, and the luminescent material 40 covers the first sub-pixel definition layer 31 between the two second sub-pixel definition layers 32.

In some embodiments, the anode 200 includes a first transparent electrode, a metal electrode and a second transparent electrode that are stacked in sequence. The first transparent electrode and the second transparent electrode may be made of the same transparent metal material, or may be made of different transparent metal materials, such as ITO and IZO, which is not specifically limited herein. For example, the anode 200 may be made of ITO/Ag/ITO or IZO/Ag/IZO.

Figure 6:
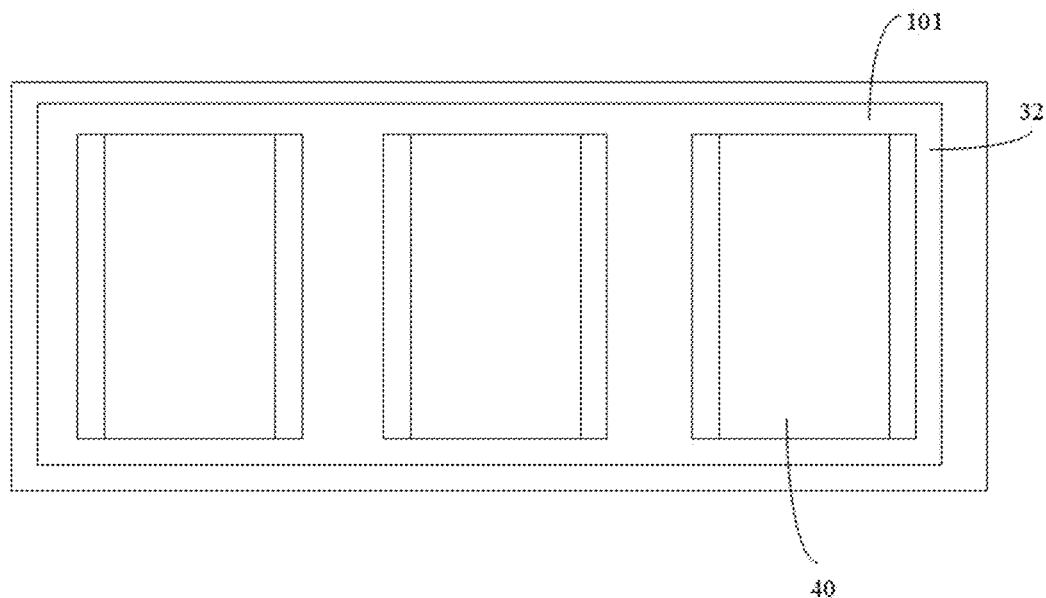
FIG. 6 is a top view of a pixel structure according to another embodiment of the present application.

It can be understood that, as shown in FIG. 6, in addition to adopting the above-mentioned line bank structure, the groove 11 structure of the present application may further be applied to a side-by-side (SBS) pixelation structure, which is not specifically limited herein.

A manufacturing method for a display panel includes the following steps.

Step 10: Provide an array substrate 100 including a planarization layer 101, and form a groove 11 in the planarization layer 101 through etching, where the groove 11 may be formed through etching using a photolithgraphy process.

Step 20: Manufacture an anode 200 on the planarization layer 101, and place an end of the anode 200 in the groove 11.

Step 30: Manufacture a PDL 300, where the PDL 300 fills the groove 11 and covers the anode 200 and the planarization layer 101; and form a pixel opening 301 on the PDL 300 through etching, so that the anode 200 is partially exposed in the pixel opening 301. The PDL 300 may be formed by using a deposition method.

In the manufacturing method for a display panel according to the embodiment of the present application, the groove 11 is formed in the planarization layer 101 of the array substrate 100, so that the end of the anode 200 falls in the groove 11 after etching to enable the PDL 300 to cover the end of the anode 200, and a height at which the PDL 300 covers the end of the anode 200 is increased without changing the height of the PDL 300 relative to the anode 200. This prevents the anode 200 from being exposed during etching, so as to achieve a better protection effect.

To better implement the display panel according to the present application, the present application further provides a display apparatus, where the display apparatus includes the display panel. Since the display apparatus includes the above-mentioned display panel, the display apparatus has all the same beneficial effects, which will not be repeated in this embodiment. In the embodiments of the present application, no specific limitation is imposed on the application of the display apparatus. The display apparatus may be a television set, a notebook computer, a tablet computer, a wearable display device (such as a smartband and a smartwatch), a mobile phone, a virtual reality device, an augmented reality device, an in-vehicle display, an advertising light box or any other product or component with a display function.

In the above-mentioned embodiments, the description of each embodiment has its own emphasis. For parts that are not described in detail in an embodiment, reference may be made to related descriptions of other embodiments.

The display panel, the manufacturing method for a display panel, and the display apparatus according to embodiments of the present application are described in detail above. Specific examples are applied herein to illustrate the principle and implementations of the present application. The description of the above-mentioned embodiments is only used to help understand the technical solutions of the present application and the core idea thereof. A person of ordinary skill in the art should understand that he/she may still modify the technical solutions described in the foregoing embodiments, or equivalently replace some of the technical features therein. However, these modifications or replacements do not make the essence of the corresponding technical solutions depart from the scope of the technical solutions of each embodiment of the present application.

What is claimed is:

1. A display panel, comprising:
    an array substrate comprising a planarization layer, the planarization layer being provided with a groove;
    a pixel definition layer (PDL) arranged on the planarization layer and filling the groove, the PDL being provided with a pixel opening; and
    an anode arranged between the planarization layer and the PDL, an end of the anode being placed in the groove, and a middle portion of the anode being exposed in the pixel opening;
    wherein the groove comprises a first groove body and a second groove body that are spaced;
    wherein the end of the anode being placed in the groove comprises one end of the anode being located in the first groove body, and another end of the anode being located in the second groove body;
    wherein the array substrate comprises a base, an active layer, a gate layer, and a source-drain layer that are stacked in sequence, the planarization layer is disposed on the source-drain layer, and the source-drain layer comprises a source and a drain; and
    the planarization layer is provided with a through hole, the through hole communicates with the second groove body, the source is partially exposed in the through hole, and the anode is in contact with the source via the through hole.

2. The display panel according to claim 1, wherein a gap is provided between the anode and a sidewall of the groove.

3. The display panel according to claim 1, further comprising:
    a transition layer arranged between the drain source and the anode, the transition layer filling the through hole.

4. The display panel according to claim 1, wherein a height of the groove ranges from 0.5 µm to 1 µm, and the height is a distance from a bottom wall of the groove to an opening end face of the groove.

5. The display panel according to claim 1, wherein a distance between one side of the PDL that faces away from the planarization layer and a bottom wall of the groove ranges from 0.6 µm to 7 µm.

6. The display panel according to claim 1, wherein the PDL comprises:
    a plurality of first sub-pixel definition layers, orthographic projections thereof on the array substrate being arranged in a first direction; and
    a plurality of second sub-pixel definition layers, orthographic projections thereof on the array substrate being arranged in a second direction, a height of the second sub-pixel definition layer being greater than a height of the first sub-pixel definition layer, and the first direction and the second direction intersecting.

7. The display panel according to claim 6, wherein a luminescent material of a same color is arranged between two adjacent second sub-pixel definition layers, and the luminescent material covers the first sub-pixel definition layer between the two second sub-pixel definition layers.

8. The display panel according to claim 1, wherein the anode comprises a first transparent electrode, a metal electrode, and a second transparent electrode that are stacked in sequence.

9. A display apparatus, comprising a display panel, wherein the display panel comprises:
    an array substrate comprising a planarization layer, the planarization layer being provided with a groove;
    a pixel definition layer (PDL) arranged on the planarization layer and filling the groove, the PDL being provided with a pixel opening; and
    an anode arranged between the planarization layer and the PDL, an end of the anode being placed in the groove, and a middle portion of the anode being exposed in the pixel opening;
    wherein the groove comprises a first groove body and a second groove body that are spaced;
    wherein the end of the anode being placed in the groove comprises one end of the anode being located in the first groove body, and another end of the anode being located in the second groove body;
    wherein the array substrate comprises a base, an active layer, a gate layer, and a source-drain layer that are stacked in sequence, the planarization layer is disposed on the source-drain layer, and the source-drain layer comprises a source and a drain; and
    the planarization layer is provided with a through hole, the through hole communicates with the second groove body, the source is partially exposed in the through hole, and the anode is in contact with the source via the through hole.

10. The display apparatus according to claim 9, wherein a gap is provided between the anode and a sidewall of groove.

11. The display apparatus according to claim 9, wherein the display panel further comprises:
    a transition layer arranged between the source and the anode, the transition layer filling the through hole.

12. The display apparatus according to claim 9, wherein a height of the groove ranges from 0.5 µm to 1 µm, and the height is a distance from a bottom wall of the groove to an opening end face of the groove.

13. The display apparatus according to claim 9, wherein the PDL comprises:
    a plurality of first sub-pixel definition layers, orthographic projections thereof on the array substrate being arranged in a first direction; and
    a plurality of second sub-pixel definition layers, orthographic projections thereof on the array substrate being arranged in a second direction, a height of the second sub-pixel definition layer being greater than a height of the first sub-pixel definition layer, and the first direction and the second direction intersecting.

14. The display apparatus according to claim 13, wherein a luminescent material of a same color is arranged between two adjacent second sub-pixel definition layers, and the luminescent material covers the first sub-pixel definition layer between the two second sub-pixel definition layers.

15. The display apparatus according to claim 9, wherein the anode comprises a first transparent electrode, a metal electrode, and a second transparent electrode that are stacked in sequence.

* * * * *